(12) United States Patent
Park et al.

(10) Patent No.: US 8,501,617 B2
(45) Date of Patent: Aug. 6, 2013

(54) SEMICONDUCTOR DEVICES INCLUDING A TOPMOST METAL LAYER WITH AT LEAST ONE OPENING AND THEIR METHODS OF FABRICATION

(75) Inventors: Joo-Sung Park, Gyeonggi-do (KR); Ae-Ran Hong, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 151 days.

(21) Appl. No.: 12/855,870

(22) Filed: Aug. 13, 2010

(65) Prior Publication Data

US 2010/0304537 A1 Dec. 2, 2010

Related U.S. Application Data

(62) Division of application No. 11/395,047, filed on Mar. 31, 2006, now Pat. No. 7,795,731.

(30) Foreign Application Priority Data

Jun. 17, 2005 (KR) .................................. 2005-52654

(51) Int. Cl.
 *H01L 21/4763* (2006.01)
(52) U.S. Cl.
 USPC ....... 438/622; 438/614; 438/625; 257/E21.59
(58) Field of Classification Search
 USPC .............................. 438/612–614; 257/E21.59
 See application file for complete search history.

(56) References Cited

U.S. PATENT DOCUMENTS

| 4,625,227 | A | 11/1986 | Hara et al. |
| 5,023,699 | A | 6/1991 | Hara et al. |
| 5,229,642 | A | 7/1993 | Hara et al. |
| 5,371,411 | A | 12/1994 | Hara et al. |
| 5,468,998 | A | 11/1995 | Hara et al. |

(Continued)

FOREIGN PATENT DOCUMENTS

| JP | 57-045259 | 3/1982 |
| JP | 11-186512 | 7/1999 |

(Continued)

OTHER PUBLICATIONS

English Abstract for Publication No. 57-045259.

(Continued)

*Primary Examiner* — Thanhha Pham
(74) *Attorney, Agent, or Firm* — F. Chau & Associates, LLC

(57) ABSTRACT

In one embodiment, a semiconductor device has a topmost or highest conductive layer with at least one opening. The semiconductor device includes a semiconductor substrate having a cell array region and an interlayer insulating layer covering the substrate having the cell array region. The topmost conductive layer is disposed on the interlayer insulating layer in the cell array region. The topmost conductive layer has at least one opening. A method of fabricating the semiconductor device is also provided. The openings penetrating the topmost metal layer help hydrogen atoms reach the interfaces of gate insulating layers of cell MOS transistors and/or peripheral MOS transistors during a metal alloy process, thereby improve a performance (production yield and/or refresh characteristics) of a memory device.

22 Claims, 15 Drawing Sheets

U.S. PATENT DOCUMENTS

| | | |
|---|---|---|
| 5,539,257 A | 7/1996 | Hara et al. |
| 5,552,639 A | 9/1996 | Hara et al. |
| 5,583,381 A | 12/1996 | Hara et al. |
| 6,337,514 B1 | 1/2002 | Ooishi |
| 6,381,167 B2 | 4/2002 | Ooishi et al. |
| 6,521,932 B1 | 2/2003 | Kumagai et al. |
| 6,549,445 B2 | 4/2003 | Ooishi et al. |
| 6,639,263 B2 | 10/2003 | Kumagai et al. |
| 6,656,833 B2 | 12/2003 | Isogai |
| 6,965,140 B2 | 11/2005 | Kumagai et al. |
| 2003/0153172 A1* | 8/2003 | Yajima et al. ............ 438/612 |
| 2004/0147137 A1* | 7/2004 | Hiraiwa et al. ............ 438/778 |

FOREIGN PATENT DOCUMENTS

| | | |
|---|---|---|
| JP | 2000-269455 | 9/2000 |
| JP | 2001-308181 | 11/2001 |
| JP | 2001-344965 | 12/2001 |

OTHER PUBLICATIONS

English Abstract for Publication No. 2000-269455.
English Abstract for Publication No. 2001-308181.
English Abstract for Publication No. 2001-344965.
Japanese Office Action Dated March 21, 2012.
English Abstract for Publication No. 57-045259, published on Mar. 15, 1982.
English Abstract for Publication No. 2000-269455, published on Sep. 29, 2000.
English Abstract for Publication No. 2001-308181, published on Nov. 2, 2001.
English Abstract for Publication No. 2001-344965, published on Dec. 14, 2001.
English Abstract for Publication No. JP 11-186512, published on Jul. 9, 1999.

\* cited by examiner

SEMICONDUCTOR DEVICES INCLUDING A TOPMOST METAL LAYER WITH AT LEAST ONE OPENING AND THEIR METHODS OF FABRICATION

CROSS-REFERENCE TO RELATED FOREIGN APPLICATION

This application is a divisional of U.S. application Ser. No. 11/395,047, filed on Mar. 31, 2006 now U.S. Pat. No. 7,795,731, which in turn claims priority from Korean Patent Application No. 10-2005-0052654, filed Jun. 17, 2005, the disclosures of both of which are herein incorporated herein by reference in their entireties.

FIELD OF THE INVENTION

The present invention relates to semiconductor devices and, more particularly, to semiconductor devices having a topmost metal layer having at least one opening and their methods of fabrication.

BACKGROUND OF THE INVENTION

Semiconductor devices such as DRAM devices include a plurality of cells. Each of the DRAM cells has a cell capacitor and a cell transistor, which are electrically connected in series, and the cell transistor is electrically connected to a bit line. The cell transistor is turned on during a writing operation to transfer data corresponding to a bit line voltage to the cell capacitor. Further, the cell transistor is also turned on during a read operation to transfer data stored in the cell capacitor to the bit line. On the contrary, the cell transistor is turned off in a stand-by mode to retain data stored in the cell capacitor.

However, even though the cell transistor is turned off in a stand-by mode, the data stored in the cell capacitor (that is, an electrical charge) may be lost through various leakage current paths as time elapses. The leakage current paths are closely related to characteristics of the cell transistor. For example, if the so-called interface trap density that is generally known to exist between a gate insulating layer of the cell transistor and the surface of the semiconductor substrate increases or the channel length of the cell transistor decreases, the cell transistor may exhibit high leakage current when the cell transistor is turned off. Thus, the DRAM devices employ refresh circuits to periodically re-store desired data into the cell capacitors.

If the cell transistor shows high leakage current, a cycle time of the refresh operation may be reduced. In this case, power consumption of the DRAM device may increase. Thus, leakage current characteristic of the cell transistor should be improved in order to realize a low power DRAM device.

Most semiconductor devices including the DRAM devices are fabricated using a hydrogen alloy process as a back-end process. The hydrogen alloy process is very effective to reduce defects of a MOS transistor, particularly an interface trap density between a gate insulating layer and a surface of a semiconductor substrate. Thus, if the hydrogen alloy process is performed, the refresh characteristic of the DRAM device can be improved. In general, the hydrogen alloy process is performed after formation of metal interconnections and a passivation layer.

In order to improve an integration density and an operating speed of the DRAM device, a multi-layered metal technique has been widely used and the cell transistor has been gradually scaled down. In this case, a topmost metal layer used as a power line may be disposed over a cell array region of the DRAM device. The power line is typically designed to have a plate shape, thereby covering most of the cell array region. This is for minimizing voltage drop due to power line resistance. In this case, even though the hydrogen alloy process is performed, the planar type topmost metal layer covering the cell array region may prevent hydrogen atoms provided during the hydrogen alloy process from reaching the interface of the gate insulating layer of the cell transistor. Thus, when the multi-layered metal technique is employed in the DRAM device, there may be limited improvement in the refresh characteristic of the DRAM device.

A semiconductor device having a metal layer is described in U.S. Pat. No. 5,229,642 to Hara et al., entitled "Resin Molded Type Semiconductor Device Having a Conductor Film." According to Hara et al., a metal guard ring is provided on an edge of a tetragonal semiconductor substrate, and the substrate having the metal guard ring is covered with a passivation layer. If the substrate having the passivation layer is encapsulated by a package process using a resin molding layer, the stress due to the resin molding layer may be concentrated on the passivation layer on four corner regions of the semiconductor substrate. As a result, cracks may be generated inside the passivation layer. Thus, Hara et al. provides a hole such as a slit in the metal guard ring on the four corner regions in order to alleviate the stress of the resin molding layer.

SUMMARY

In an aspect of the present invention, a semiconductor device having a topmost metal layer disposed at least over a cell array region is provided. The semiconductor device includes a semiconductor substrate having a cell array region and an interlayer insulating layer covering the substrate having the cell array region. A topmost metal layer is disposed on the interlayer insulating layer in the cell array region. The topmost metal layer has at least one opening.

In some embodiments of the present invention, the cell array region may include a plurality of memory cells such as DRAM cells formed at the semiconductor substrate. In this case, the interlayer insulating layer covers the memory cells. Each of the memory cells may include a cell MOS transistor formed at the semiconductor substrate and a cell capacitor electrically connected to one of source/drain regions of the cell MOS transistor.

In other embodiments, lower metal interconnections may be disposed on the interlayer insulating layer in the cell array region, and the lower metal interconnections and the interlayer insulating layer may be covered with a lower inter-metal insulating layer. In this case, the topmost metal layer may be disposed on the lower inter-metal insulating layer, and the at least one opening may be located over at least a portion of the lower inter-metal insulating layer between the lower metal interconnections. In addition, upper metal interconnections may be disposed on the lower inter-metal insulating layer in the cell array region, and the upper metal interconnections and the lower inter-metal insulating layer may be covered with an upper inter-metal insulating layer. In this case, the upper metal interconnections may be disposed to cross over the lower metal interconnections, and the topmost metal layer may be disposed on the upper inter-metal insulating layer. Further, the at least one opening may be disposed over at least one of overlap regions of the lower inter-metal insulating layer between the lower metal interconnections and the upper inter-metal insulating layer between the upper metal interconnections.

In yet other embodiments, the at least one opening may include a plurality of openings penetrating the topmost metal layer. The plurality of openings may include a plurality of slits and/or a plurality of holes, e.g., substantially circular holes. A width of each of the plurality of slits and a distance between the slits may be equal to or greater than about 0.5 µm. A diameter of each of the plurality of circular holes and a distance between the circular holes may be equal to or greater than about 0.2 µm.

In still other embodiments, the substrate having the topmost metal layer may be covered with a passivation layer. The passivation layer may include a silicon oxide layer and a silicon nitride layer, which are sequentially stacked.

In another aspect of the present invention, the semiconductor device includes a semiconductor substrate having a cell array region and a peripheral circuit region adjacent to the cell array region. A plurality of memory cells such as DRAM cells are provided at the semiconductor substrate in the cell array region. At least one peripheral MOS transistor is provided at the semiconductor substrate in the peripheral circuit region. The substrate having the memory cells and the peripheral MOS transistor is covered with an interlayer insulating layer. A first topmost metal layer is disposed on the interlayer insulating layer in the cell array region, and the first topmost metal layer has at least one first opening. A second topmost metal layer is disposed on the interlayer insulating layer in the peripheral circuit region, and the second topmost metal layer has at least one second opening located over the peripheral MOS transistor.

In yet another aspect of the present invention, a method of fabricating a semiconductor device having a topmost metal layer disposed over at least a cell array region. The method includes preparing a semiconductor substrate having a cell array region and forming an interlayer insulating layer that covers the semiconductor substrate. A topmost metal layer is formed on the interlayer insulating layer. The topmost metal layer is formed to have at least one opening located over the cell array region.

In some embodiments of the present invention, a plurality of memory cells are formed at the semiconductor substrate in the cell array region prior to formation of the interlayer insulating layer.

In other embodiments, lower metal interconnections may be formed on the interlayer insulating layer in the cell array region prior to formation of the topmost metal layer, and a lower inter-metal insulating layer may be formed over the lower metal interconnections. In this case, the topmost metal layer may be formed so that the at least one opening is disposed on at least a portion of the lower inter-metal insulating layer between the lower metal interconnections. Further, upper metal interconnections may be formed on the lower inter-metal insulating layer in the cell array region, and an upper inter-metal insulating layer may be formed over the upper metal interconnections. The upper metal interconnections may be formed to cross over the lower metal interconnections. In this case, the topmost metal layer may be formed so that the at least one opening is disposed on at least one of overlap regions of the lower inter-metal insulating layer between the lower metal interconnections and the upper inter-metal insulating layer between the upper metal interconnections.

In yet other embodiments, the at least one opening may be formed to have a plurality of slits and/or a plurality of holes, e.g., circular holes. The plurality of slits may be formed to have a width of about 0.5 µm or greater, and the plurality of holes may be formed to have a diameter of about 0.2 µm or greater.

In still other embodiments, a passivation layer may be formed over the topmost metal layer, and the substrate having the passivation layer may be annealed. The passivation layer may be formed by sequentially stacking a silicon oxide layer and a silicon nitride layer. The annealing process of the substrate may be performed using an ambient gas containing at least a hydrogen gas.

In still another aspect of the present invention, the method of fabricating a semiconductor device includes preparing a semiconductor substrate having a cell array region and a peripheral circuit region. A plurality of memory cells and at least one peripheral MOS transistor are formed at the semiconductor substrate in the cell array region and at the semiconductor substrate in the peripheral circuit region, respectively. An interlayer insulating layer is formed over the memory cells and the peripheral MOS transistor. A first topmost metal layer and a second topmost metal layer are formed on the interlayer insulating layer in the cell array region and on the interlayer insulating layer in the peripheral circuit region, respectively. The first topmost metal layer is formed to have at least one first opening, and the second topmost metal layer is formed to have at least one second opening disposed over the peripheral MOS transistor.

In one embodiment, a semiconductor device comprises a semiconductor substrate; a gate electrode formed on the semiconductor substrate; a gate insulating layer disposed between the substrate and the gate electrode; an inter-metal insulating layer overlying the gate electrode; a passivation layer overlying the inter-metal insulating layer; and a highest conductive layer sandwiched between the passivation layer and the inter-metal insulating layer, the highest conductive layer having at least one opening aligned with the gate insulating layer to provide a path for external hydrogen atoms to reach an interface between the gate insulation layer and the substrate.

Preferably, the semiconductor device further comprises upper metal interconnections having at least a pair of parallel runs in the plane of the substrate defining an upper opening therebetween; and lower metal interconnections having at least a pair of parallel runs in the plane of the substrate defining a lower opening therebetween. The defined upper and lower openings overlap with one another to define at least one open region defined by and extending through the upper and lower metal interconnections perpendicular to the plane of the substrate. The opening in the highest conductive layer is aligned with the at least one open region to define the path.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 6A through 9A are cross-sectional views taken along line I-I' of FIG. 2 to illustrate methods of fabricating DRAM devices according to embodiments of the present invention;

FIGS. 6B through 9B are cross-sectional views taken along a line II-II' of FIG. 2 to illustrate methods of fabricating DRAM devices according to embodiments of the present invention;

DETAILED DESCRIPTION

Figure 1:
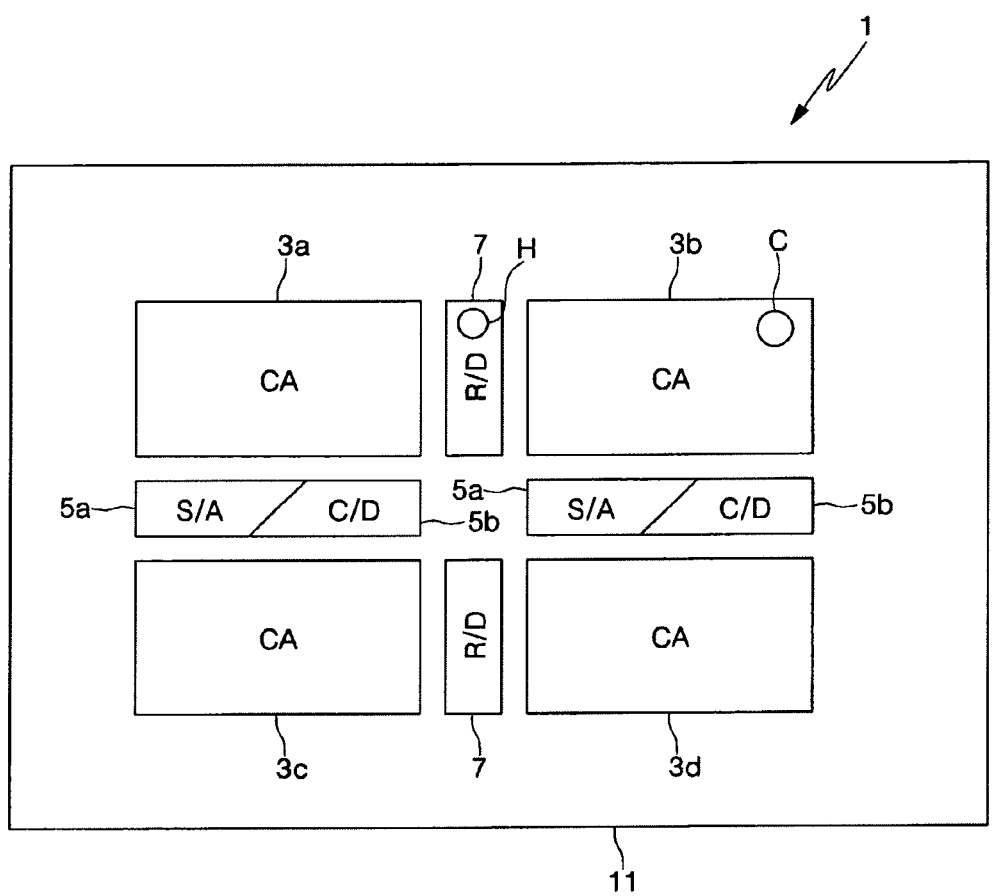
FIG. 1 is a schematic block diagram illustrating a semiconductor memory device which is applicable to embodiments of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIG. 1 is a schematic block diagram illustrating a semiconductor memory device which is applicable to some embodiments of the present invention.

Referring to FIG. 1, the semiconductor memory device 1 includes a semiconductor substrate 11 having a cell array region and a peripheral circuit region adjacent to the cell array region. The cell array region may include a plurality of cell blocks, for example, four cell blocks 3a, 3b, 3c and 3d. Each of the cell blocks comprises a plurality cells, for example, a plurality of DRAM cells. Further, the peripheral circuit region may include a row decoder 7, a sense amplifier unit 5a and a column decoder 5b, which are formed on the semiconductor substrate 11 between the cell blocks 3a, 3b, 3c and 3d or on the semiconductor substrate 11 adjacent to the cell blocks. Further, the row decoder 7 may include a high voltage circuit region H.

Figure 2:
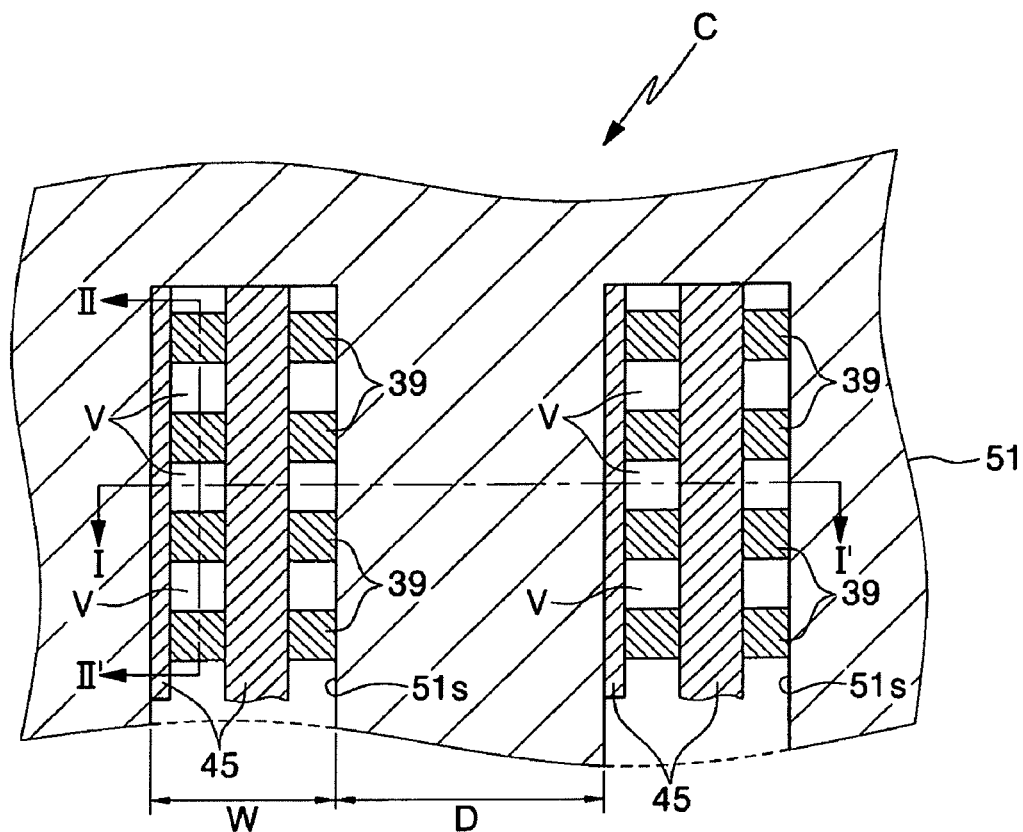
FIG. 2 is an enlarged plan view illustrating a portion of a cell array region of FIG. 1.
Figure 3A:
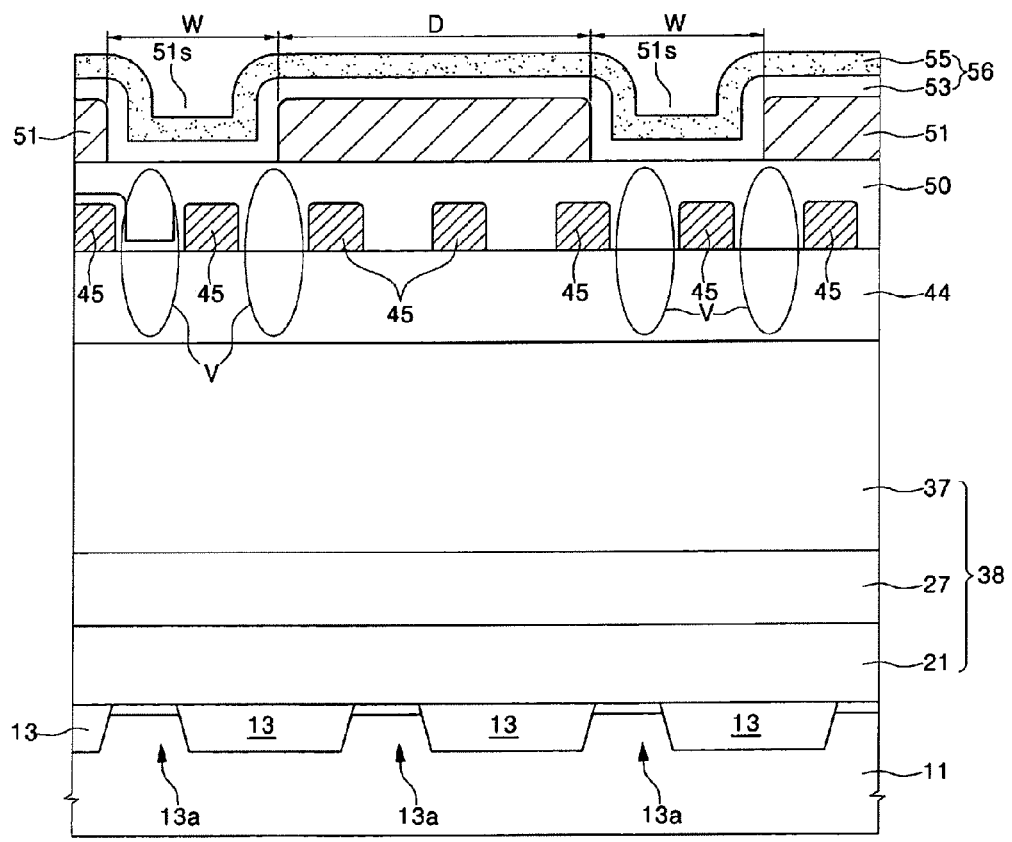
FIG. 3A is a cross-sectional view taken along line I-I' of FIG. 2.
Figure 3B:
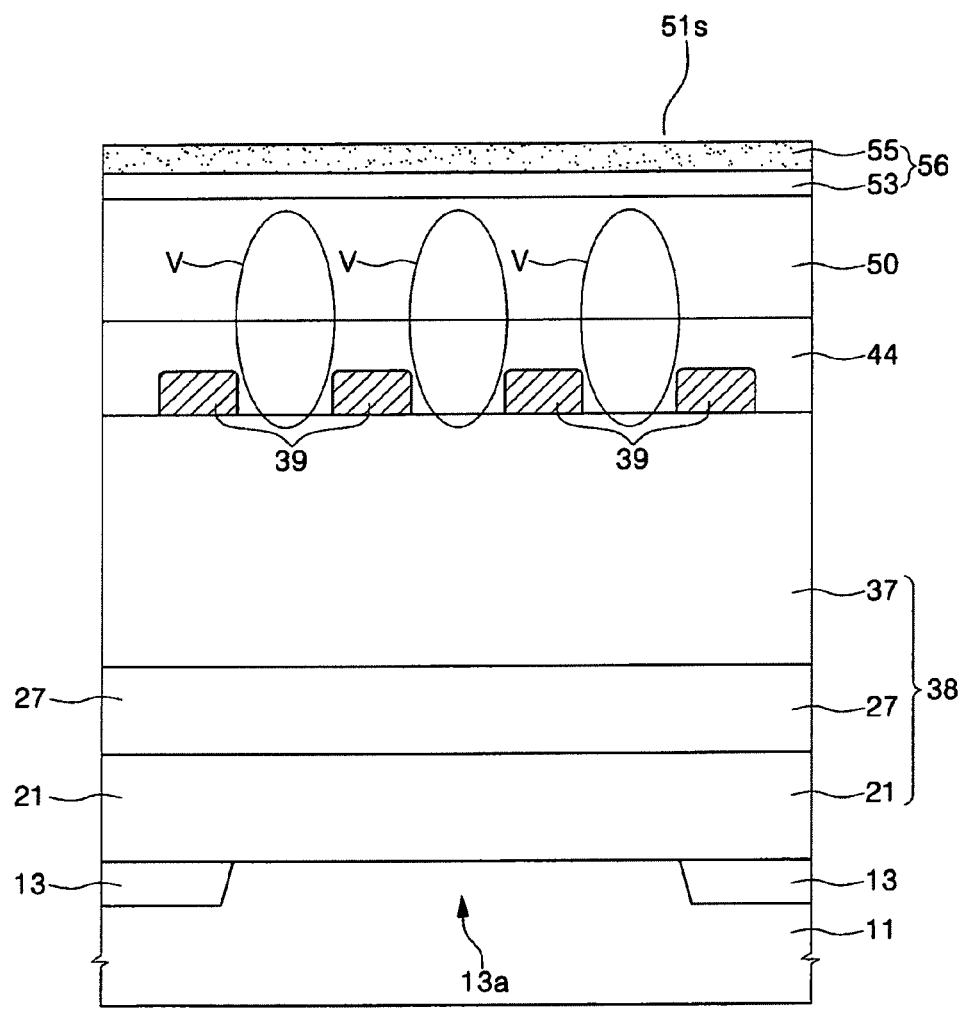
FIG. 3B is a cross-sectional view taken along line II-II' of FIG. 2.

FIG. 2 is an enlarged plan view illustrating a portion C of the cell block 3b of FIG. 1 to illustrate semiconductor devices according to an embodiment of the present invention, and FIGS. 3A and 3B are cross-sectional views taken along lines I-I' and II-II' of FIG. 2 respectively.

Referring to FIGS. 2, 3A and 3B, an isolation layer 13 is provided in a predetermined portion of the semiconductor substrate 11 to define cell active regions 13a. An interlayer insulating layer 38 is provided on the substrate 11 having the cell active regions 13a, and a plurality of first lower metal interconnections 39 may be disposed on the interlayer insulating layer 38. The interlayer insulating layer 38 may include a lower interlayer insulating layer 21, an intermediate interlayer insulating layer 27 and an upper interlayer insulating layer 37, which are sequentially stacked.

The first lower metal interconnections 39 may be used as strapping word lines of memory cells such as DRAM cells. The first lower metal interconnections 39 and the interlayer insulating layer 38 are covered with a lower inter-metal insulating layer 44.

A plurality of first upper metal interconnections 45 may be provided on the lower inter-metal insulating layer 44, and the first upper metal interconnections 45 and the lower inter-metal insulating layer 44 are covered with an upper inter-metal insulating layer 50. The first upper metal interconnections 45 may be disposed to cross over the first lower metal interconnections 39. For example, the first upper metal interconnections 45 may cross the first lower metal interconnections 39 at right angles. As a result, plural overlap regions V of the lower inter-metal insulating layer 44 (between the first lower metal interconnections 39) and the upper inter-metal insulating layer 50 (between the first upper metal interconnections 45) may be provided. In other words, intersection regions of lower gap regions between the first lower metal interconnections 39 and upper gap regions between the first upper metal interconnections 45 may not include any metal interconnections.

A first topmost conductive layer, e.g., a first topmost metal layer 51 is provided on the upper inter-metal insulating layer 50. The first topmost metal layer 51 may be a power line or a high voltage metal line which extends from the peripheral circuit region of FIG. 1. In this case, the first topmost metal layer 51 may have a relatively wide surface area when viewed from a top plan view. This is for reducing voltage drop due to the current flowing through the first topmost metal layer 51. However, if the first topmost metal layer 51 is disposed to cover the cell array region, for example, a substantially entire surface of the cell block 3b, the first topmost metal layer 51 may block a path of hydrogen atoms reaching the MOS transistors of the DRAM cells formed in the cell active regions 13a during a subsequent annealing process. Thus, in some embodiments, the first topmost metal layer 51 may have at least one first opening that penetrates the first topmost metal layer 51.

There may also be many first openings. For example, there may be a plurality of first elongate slits 51s as shown in FIG. 2. In this case, each of the first slits 51s may have a width W equal to or greater than about 0.5 μm, and a distance D between the first slits 51s may be also equal to or greater than about 0.5 μm. In other embodiments of the present invention, the first topmost metal layer 51 may have openings having shapes other than the elongate slits 51s, e.g., it may have instead a plurality of holes (not elongate slits), e.g., rectilinear (e.g., square or rectangular) or substantially circular holes arranged in a regular or irregular array (not shown) as the first opening discussed above. In this case, a diameter of the first holes and a distance between the first holes may be equal to or greater than about 0.2 μm. Further, the first opening may include at least one first slit and at least one first hole. In any case, the first opening (that is, the first slit 51s and/or the first hole) is preferably disposed over at least one of the overlap regions V of the lower inter-metal insulating layer 44 and the upper inter-metal insulating layer 50.

Alternatively, if the first upper metal interconnections 45 and the upper inter-metal insulating layer 50 are not provided, the first opening may be located over at least a portion of the lower inter-metal insulating layer 44 between the first lower metal interconnections 39.

The substrate 11 having the first topmost metal layer 51 is covered with a passivation layer 56. The passivation layer 56 may include, for example, a silicon oxide layer 53 and a silicon nitride layer 55, which are sequentially stacked.

Figure 4:
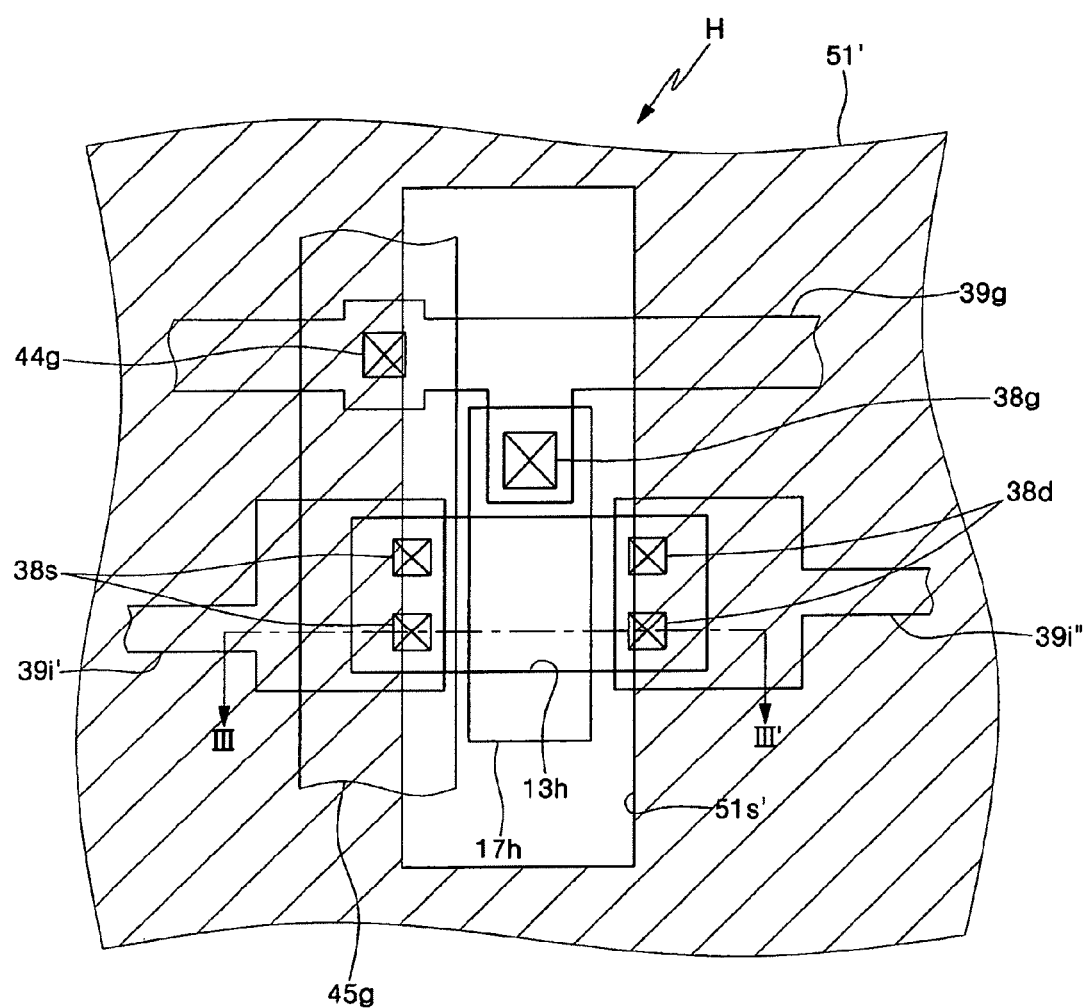
FIG. 4 is an enlarged plan view illustrating a portion of a peripheral circuit region of FIG. 1.
Figure 5:
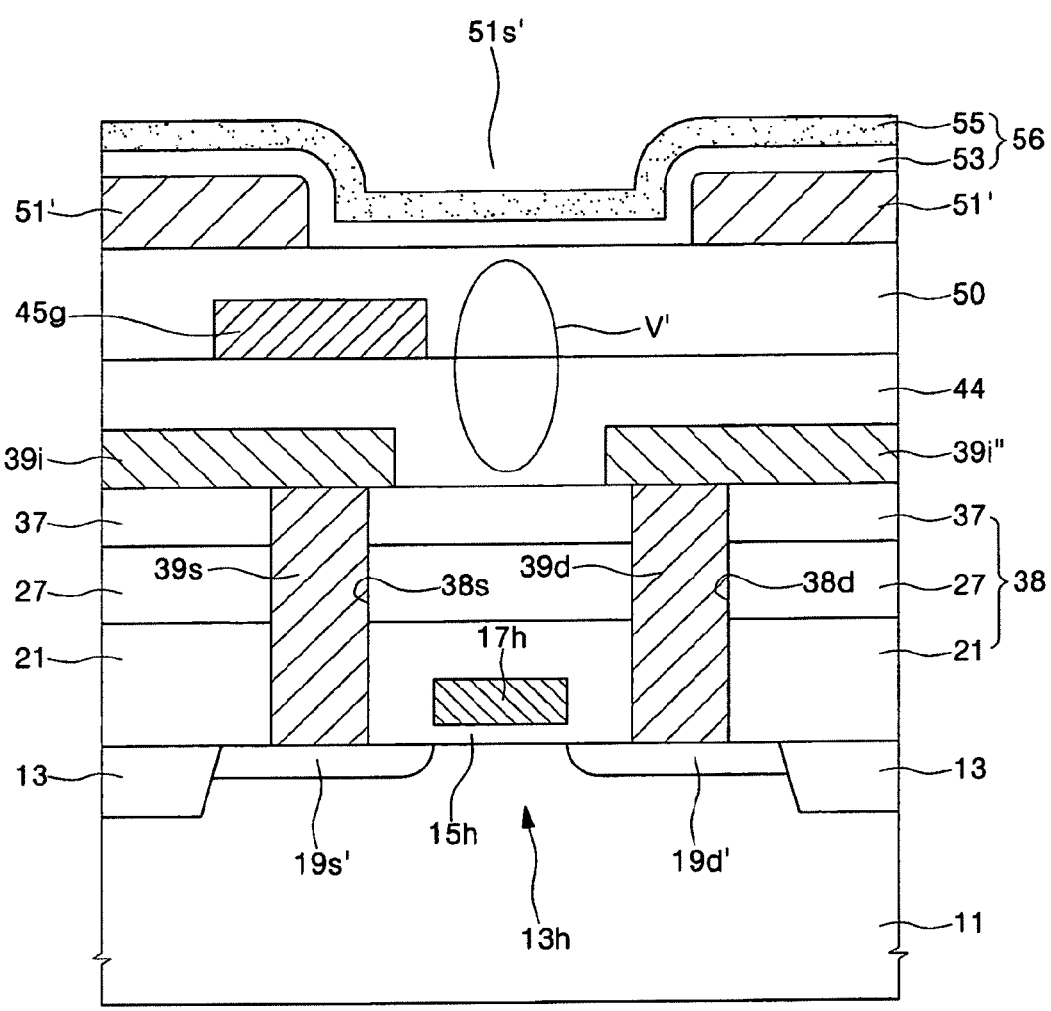
FIG. 5 is a cross-sectional view taken along line III-III' of FIG. 4.

FIG. 4 is an enlarged plan view illustrating a portion of a high voltage circuit region H of FIG. 1, and FIG. 5 is a cross-sectional view taken along line III-III' of FIG. 4. Although this embodiment is described in conjunction with the high voltage circuit region H, the present invention is not limited to the high voltage circuit region set forth herein and can be equally applicable to any other suitable peripheral region such as the sense amplifier unit (5a of FIG. 1) or the column decoder (5b of FIG. 1) within the spirit and scope of the present invention.

Referring to FIGS. 4 and 5, an isolation layer 13 is provided in a predetermined portion of a semiconductor substrate 11 to define a peripheral active region 13h. A source region 19s' and a drain region 19d' are provided in the peripheral active region 13h, and a gate electrode 17h is disposed over a channel region between the source/drain regions 19s' and 19d'. The gate electrode 17h is insulated from the channel region by a gate insulating layer 15h formed of a gate dielectric known in the art, for example, hafnium oxide. The gate electrode 17h and the source/drain regions 19s' and 19d' may constitute a peripheral MOS transistor, for example, a high voltage MOS transistor.

An interlayer insulating layer 38 is provided on the substrate 11 having the high voltage MOS transistor. The interlayer insulating layer 38 may include a lower interlayer insulating layer 21, an intermediate interlayer insulating layer 27 and an upper interlayer insulating layer 37, which are sequentially stacked. The source region 19s' and the drain region 19d' may be respectively exposed by a source contact hole 38s and a drain contact hole 38d that penetrate the interlayer insulating layer 38. Similarly, the gate electrode 17h may be exposed by a gate contact hole 38g that penetrates the interlayer insulating layer 38. The source contact hole 38s and the drain contact hole 38d may be filled with a source contact plug 39s and a drain contact plug 39d, respectively, and the gate contact hole 38g may be filled with a gate contact plug (not shown).

Second lower metal interconnections may be disposed on the interlayer insulating layer 38. The second lower metal interconnections may include a source line 39i' overlying the source contact plug 39s and a drain line 39i''' overlying the drain contact plug 39d. In addition, the second lower metal interconnections may further include a gate line 39g covering the gate contact plug. As a result, the source line 39i' and the drain line 39i''' are electrically connected to the source region 19s' and the drain region 19d', respectively, and the gate line 39g is electrically connected to the gate electrode 17h. A gap region between the second lower metal interconnections 39i', 39i''' and 39g is preferably disposed over the high voltage MOS transistor as shown in FIG. 5. For example, the gap region between the second lower metal interconnections 39i', 39i''' and 39g is preferably located over at least the channel region of the high voltage MOS transistor. The second lower metal interconnections 39i', 39i''' and 39g and the interlayer insulating layer 38 may be covered with a lower inter-metal insulating layer 44.

At least one second upper metal interconnection 45g may be disposed on the lower inter-metal insulating layer 44. The second upper metal interconnection 45g may be electrically connected to any one of the second lower metal interconnections 39i', 39i''' and 39g. For example, the second upper metal interconnection 45g may be electrically connected to the gate line 39g through a via hole (refer to 44g of FIG. 4) that penetrates the lower inter-metal insulating layer 44. The second upper metal interconnection 45g may be disposed to cross over the second lower metal interconnections 39i', 39i''' and 39g. In this case, the second upper metal interconnection 45g may also be disposed not to cover at least the channel region of the high voltage MOS transistor. The second upper metal interconnection 45g and the lower inter-metal insulating layer 44 may be covered with an upper inter-metal insulating layer 50.

A second topmost conductive layer, e.g., a second topmost metal layer 51' is provided on the upper inter-metal insulating layer 50. The second topmost metal layer 51' may have at least one second opening 51s' which may have substantially the same shape as the first opening 51s described with reference to FIGS. 2, 3A, and 3B. In this case, the second opening 51s' is preferably disposed over the high voltage MOS transistor. As a result, a metal interconnection does not exist over at least the channel region of the high voltage MOS transistor. Thus, another overlap region V', which may have substantially the same vertical structure as the overlap regions V described with reference to FIGS. 2, 3A, and 3B, may be provided over the high voltage MOS transistor. The overlap region V' may act as a hydrogen path through which external hydrogen atoms can easily reach the high voltage MOS transistors.

The substrate 11 having the second topmost metal layer 51' may be covered with a passivation layer 56. The passivation layer 56 may include, for example, a silicon oxide layer 53 and a silicon nitride layer 55, which are sequentially stacked.

FIGS. 6A through 9A are cross-sectional views taken along line I-I' of FIG. 2 to illustrate methods of fabricating a memory device such as a DRAM device according to an embodiment of the present invention, while FIGS. 6B through 9B are cross-sectional views taken along line II-II' of FIG. 2.

Figure 6A:
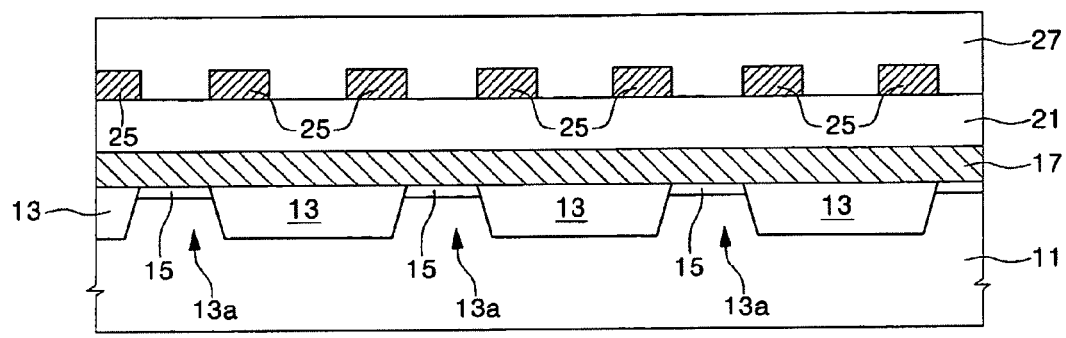
Figure 6B:
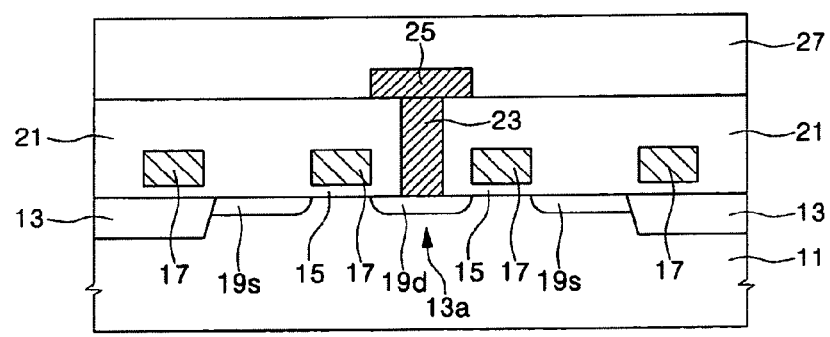

Referring to FIGS. 6A and 6B, an isolation layer 13 is formed on a predetermined portion of a semiconductor substrate 11 to define cell active regions 13a. A cell gate insulating layer 15 is formed on the cell active regions 13a, and a gate conductive layer is formed on the substrate 11 having the cell gate insulating layer 15. The gate conductive layer is patterned to form a plurality of word lines 17 that cross over the cell active regions 13a. Impurity ions are then implanted into the cell active regions 13a using the word lines 17 and the isolation layer 13 as ion implantation masks, thereby forming drain regions 19d and the source regions 19s. One of the word lines 17 and the source/drain regions 19s and 19d adjacent thereto constitute a cell MOS transistor.

A lower interlayer insulating layer 21 is formed on the substrate 11 having the cell MOS transistors. Bit line contact plugs 23, which are electrically connected to the drain regions 19d, are formed in the lower interlayer insulating layer 21. A plurality of bit lines 25 are formed on the lower interlayer insulating layer 21. The bit lines 25 are formed to cross over the word lines 17. Further, the bit lines 25 are formed to contact the bit line contact plugs 23. An intermediate interlayer insulating layer 27 is formed on the substrate 11 having the bit lines 25. The lower interlayer insulating layer 21 and the intermediate interlayer insulating layer 27 may be formed of a silicon oxide layer or other suitable dielectric materials.

Figure 7A:
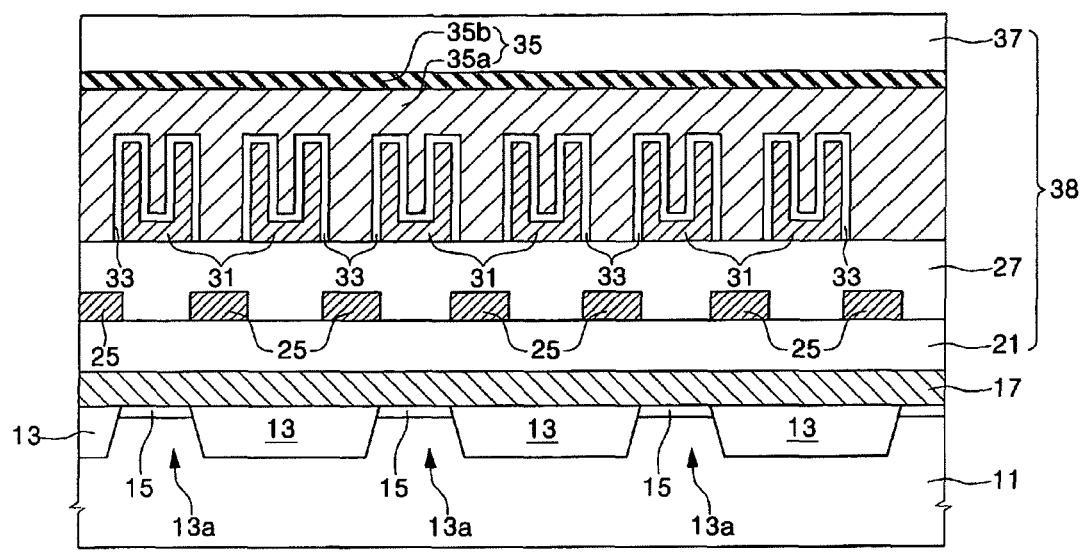
Figure 7B:
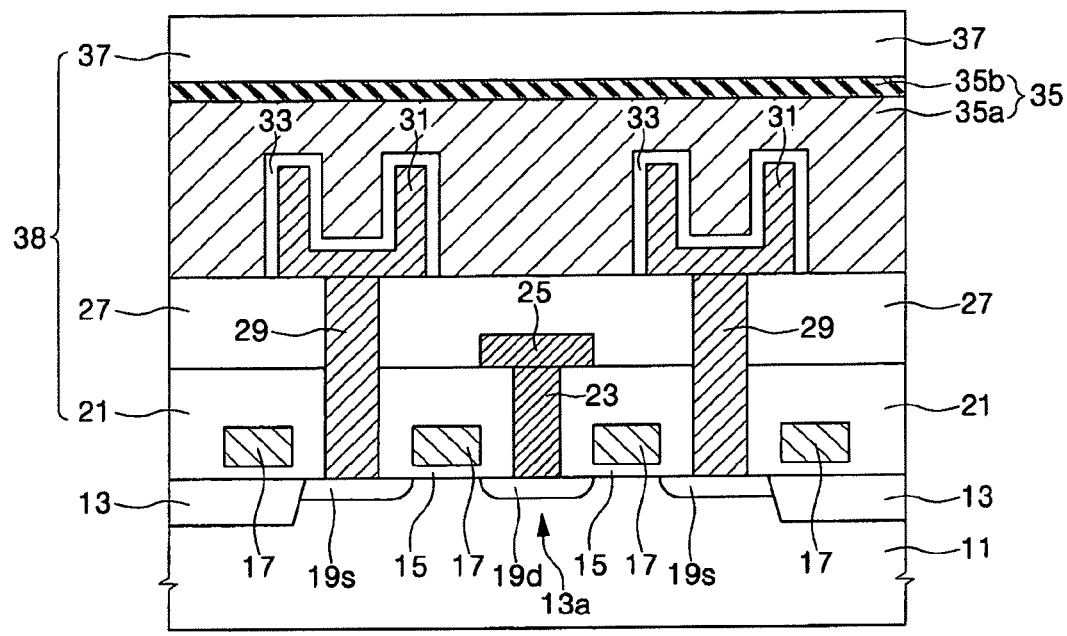

Referring to FIGS. 7A and 7B, the intermediate interlayer insulating layer 27 and the lower interlayer insulating layer 21 are patterned to form storage node contact holes exposing the source regions 19s, and storage node contact plugs 29 are formed in the storage node contact holes. A plurality of storage nodes 31 are formed on the storage node contact plugs 29 respectively, and a capacitor dielectric layer 33 is formed on the surfaces of the storage nodes 31. The storage nodes 31 may be formed to have various shapes. For example, the storage nodes 31 may be formed to have a cylindrical shape, as shown in the FIGS. 7A and 7B.

A plate electrode 35 may be formed on the substrate 11 having the capacitor dielectric layer 33. The plate electrode 35 may be formed to cover the respective cell blocks 3a, 3b, 3c and 3d, shown in FIG. 1. The plate electrode 35 may be formed of a conductive layer including a polysilicon layer. For example, the plate electrode 35 may be formed by sequentially stacking a doped polysilicon layer 35a and a titanium nitride layer 35b. In this case, the titanium nitride layer 35b is preferably formed to be thin, for example, to a thickness of about 400 Å through about 500 Å. If the titanium nitride layer 35b is formed to be thick (for example, to a thickness of several thousands Å), it may be difficult for hydrogen atoms to pass through the titanium nitride layer 35b.

An upper interlayer insulating layer 37 is formed on the substrate 11 having the plate electrode 37. The upper interlayer insulating layer 37 may also be formed of a silicon oxide layer. The lower interlayer insulating layer 21, the intermediate interlayer insulating layer 27 and the upper interlayer insulating layer 37 may collectively form an interlayer insulating layer 38.

Figure 8A:
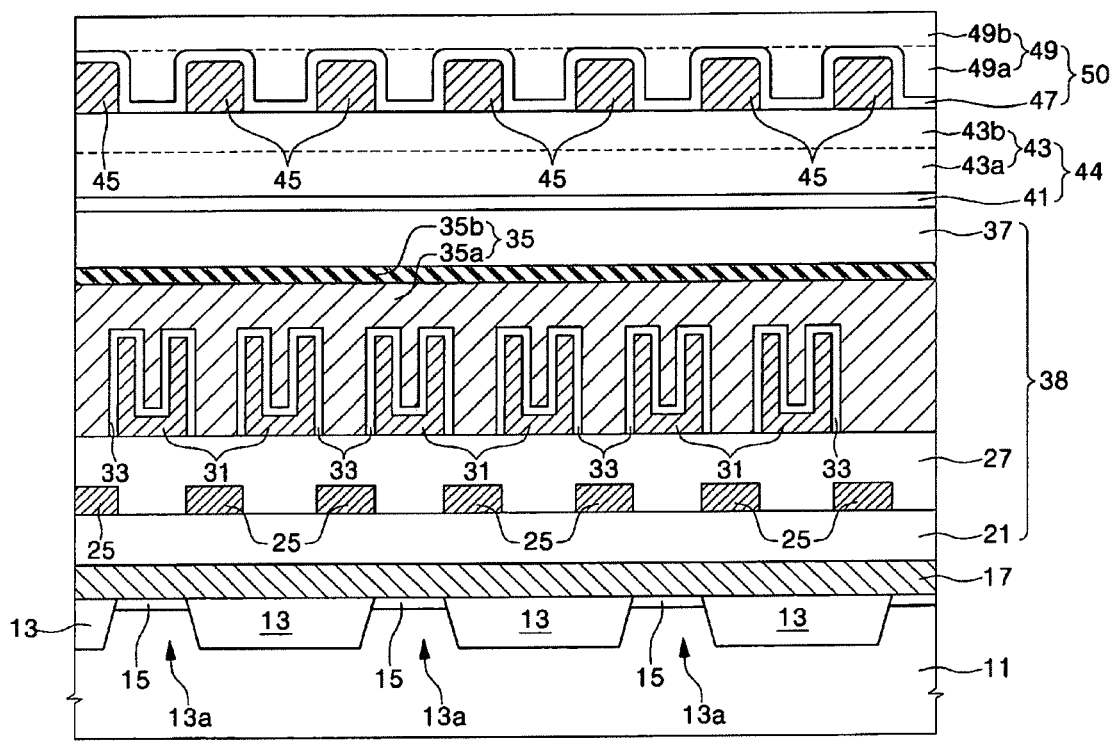
Figure 8B:
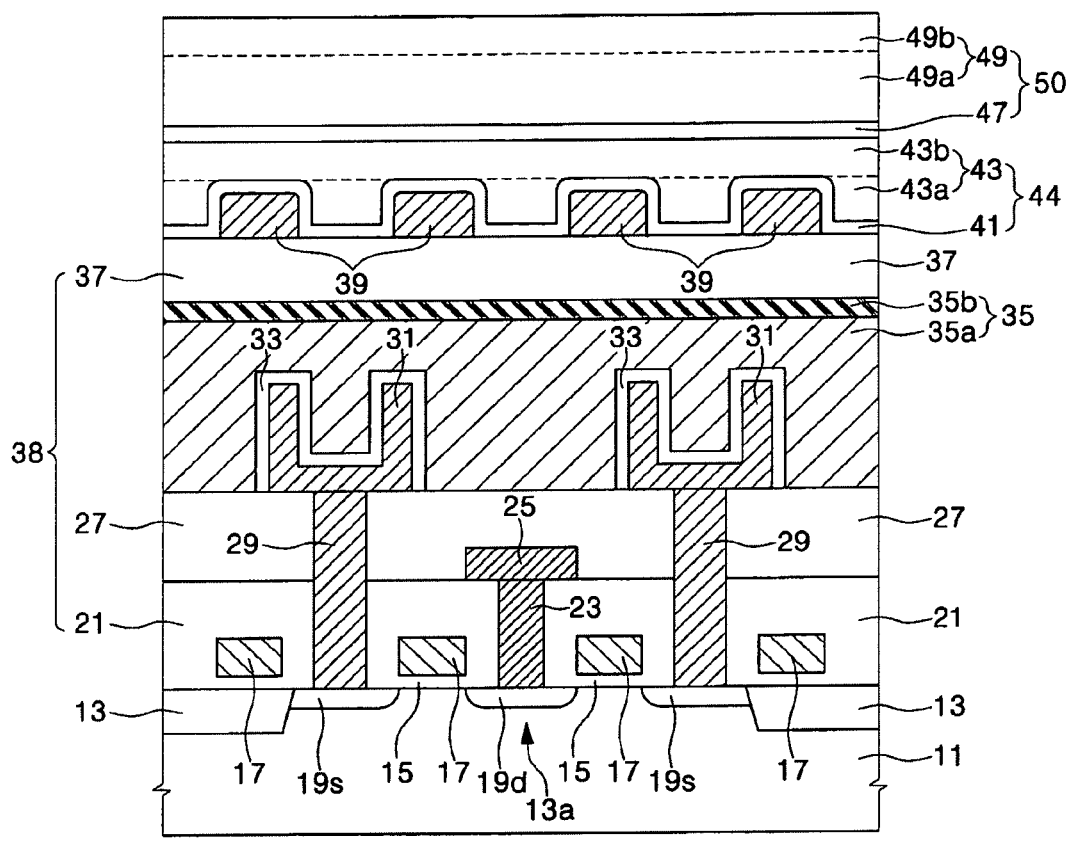

Referring to FIGS. 8A and 8B, a plurality of first lower metal interconnections 39 may be formed on the upper interlayer insulating layer 37. The first lower metal interconnections 39 may be formed of a metal layer such as an aluminum layer. The aluminum layer may be a pure aluminum layer or an aluminum alloy layer. Further, the first lower metal interconnections 39 may be formed to be thick with a thickness of several thousands Å in order to have a low electrical resistance. For example, the first lower metal interconnections 39 may be formed of an aluminum layer having a thickness of about 4000 Å. The first lower metal interconnections 39 may be used as strapping word lines to reduce a signal delay time due to the word lines 17. In this case, the first lower metal interconnections 39 may be formed to be parallel with the word lines 17.

A lower inter-metal insulating layer 44 is formed over the first lower metal interconnections 39. The lower inter-metal insulating layer 44 may be formed by several well-known methods. For example, the lower inter-metal insulating layer 44 may be formed by sequentially stacking a lower capping insulating layer 41 and an upper capping insulating layer 43. The lower capping insulating layer 41 may be formed of a plasma-enhanced tetra-ethyl-ortho-silicate (PE-TEOS) layer having a thickness of about 1000 Å, and the upper capping insulating layer 43 may be formed of a high density plasma oxide layer having excellent gap filling characteristics. Alternatively, the upper capping insulating layer 43 may be formed using a flowable oxide layer 43a and a PE-TEOS layer 43b. In this case, the flowable oxide layer 43a may be formed by coating liquid oxide material on the lower capping insulating layer 41 to fill gap regions between the first lower metal interconnections 39, and by baking the liquid oxide material at a temperature of about 400° C. The PE-TEOS layer 43b may be formed to a thickness of about 3000 Å through about 4000 Å.

Subsequently, a plurality of first upper metal interconnections 45 are formed on the lower inter-metal insulating layer 44. The first upper metal interconnections 45 may be metal interconnections electrically connected to the bit lines 25. In this case, the first upper metal interconnections 45 may be formed to cross over the first lower metal interconnections 39. The first upper metal interconnections 45 may be formed using the method of forming the first lower metal interconnections 39. However, the first upper metal interconnections 45 may be formed to a different thickness from that of the first lower metal interconnections 39. For example, the first upper metal interconnections 45 may be formed to a thickness of about 6000 Å. An upper inter-metal insulating layer 50 is formed over the first upper metal interconnections 45. The upper inter-metal insulating layer 50 may be formed using the method of forming the lower inter-metal insulating layer 44. That is, the upper inter-metal insulating layer 50 may be formed by sequentially stacking the lower capping insulating layer 47 and the upper capping insulating layer 49. Further, the upper capping insulating layer 49 may be formed to include a flowable oxide layer 49a and a PE-TEOS layer 49b.

Figure 9A:
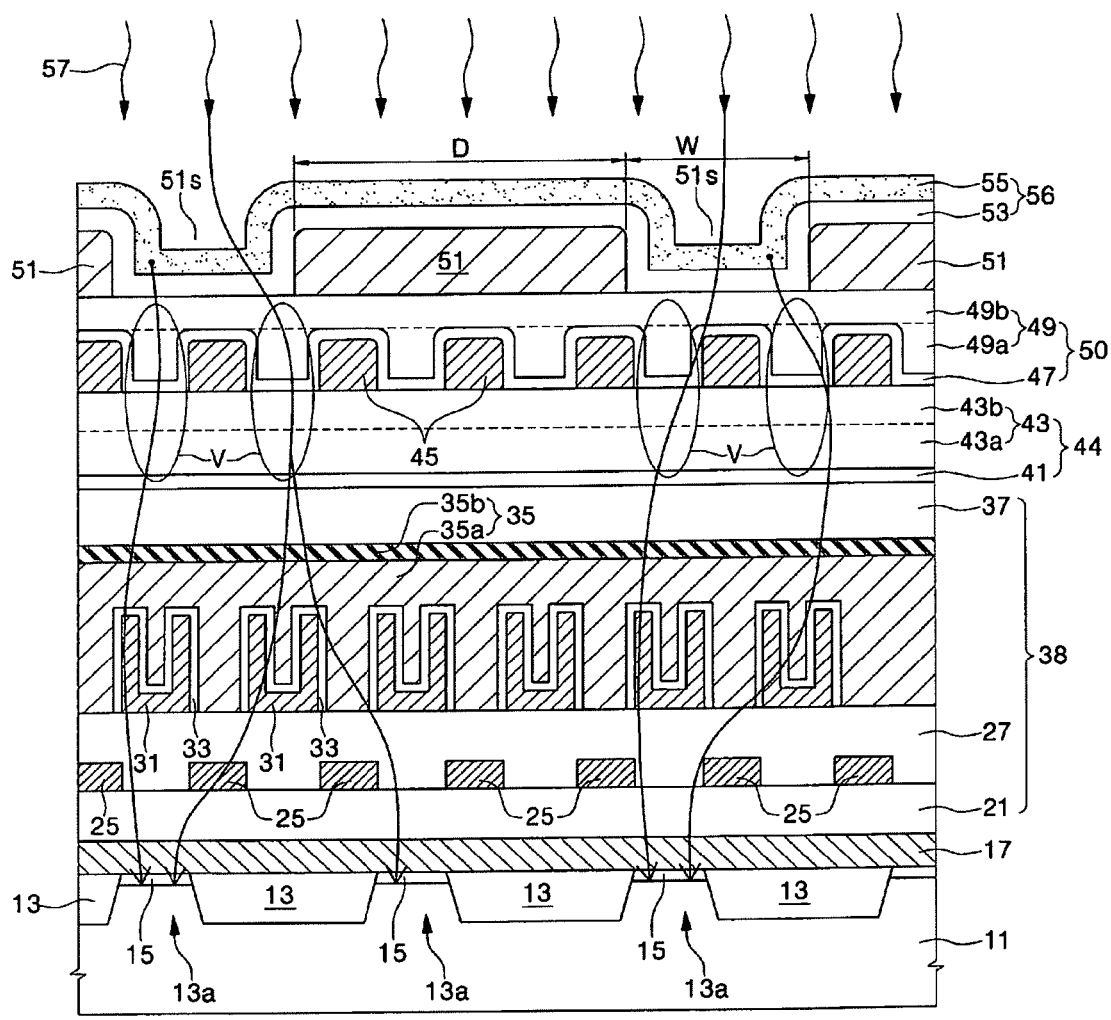
Figure 9B:
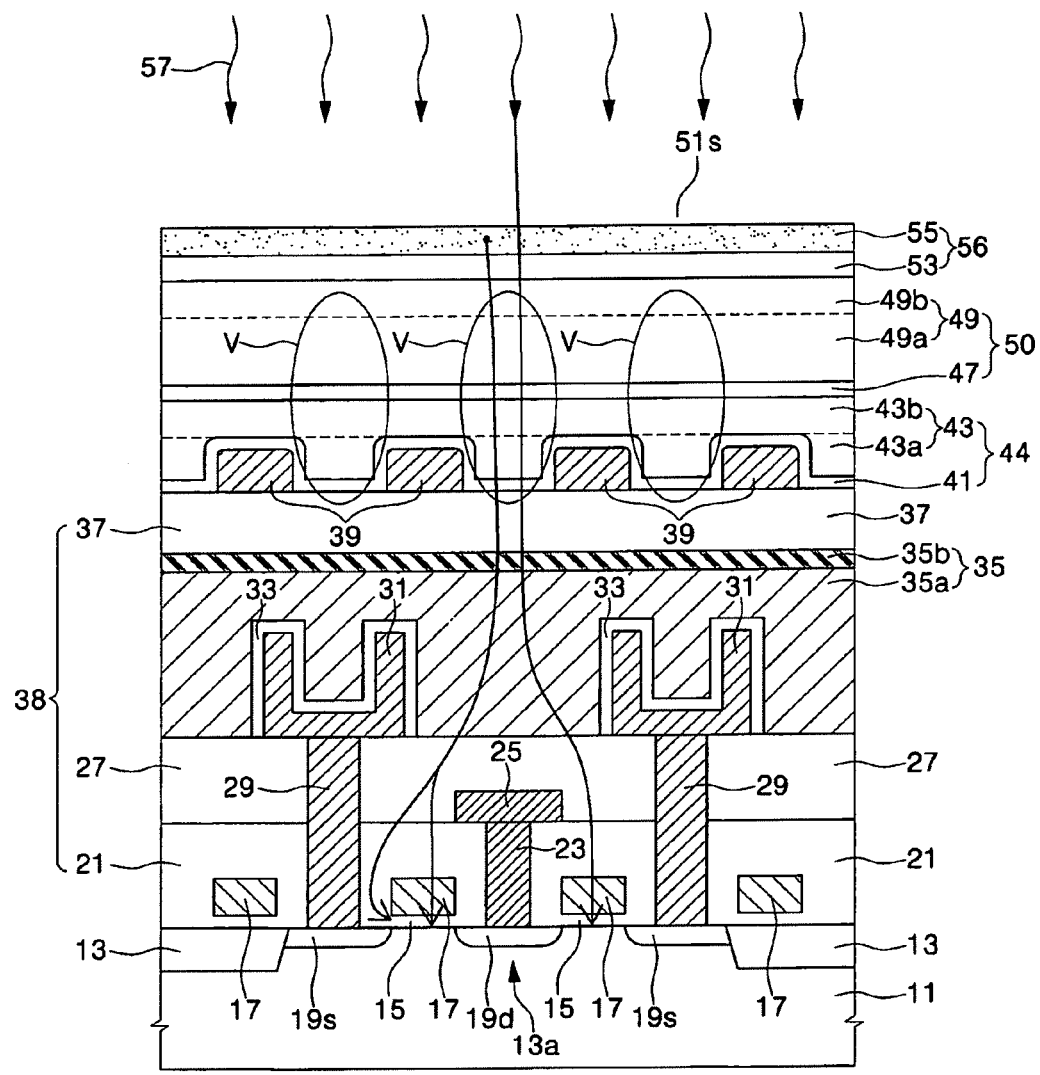

Referring to FIGS. 9A and 9B, a topmost (highest) conductive layer, e.g., a topmost metal layer is formed on the upper inter-metal insulating layer 50, and the topmost metal layer is patterned to form first topmost metal layers 51 on each of the cell blocks 3a, 3b, 3c, and 3d shown in FIG. 1. According to some embodiments of the present invention, each of the first topmost metal layers 51 may be formed to have at least one first opening. The first opening may be formed to include a plurality of first slits 51s and/or a plurality of first holes. The first slits 51s and/or the first holes may be formed by patterning the topmost metal layer. A width of each of the plurality of first slits 51s and a distance between the first slits 51s may be equal to or greater than about 0.5 μm, and a diameter of each of the plurality of first holes and a distance between the holes may be equal to or greater than about 0.2 μm.

When the first opening is foamed to include the first slits 51s, each of the first slits 51s may be formed over at least one of overlap regions V of the lower inter-metal insulating layer 44 between the first lower metal interconnections 39 and the upper inter-metal insulating layer 50 between the first upper metal interconnections 45 as shown in FIGS. 9A and 9B. Similarly, when the first opening is formed to include the first holes, each of the first holes may also be formed over at least one of the overlap regions V.

In other embodiments, when the processes of forming the first upper metal interconnections 45 and the upper inter-metal insulating layer 50 are omitted, each of the first slits 51s or the first holes may be formed over at least a portion of the lower inter-metal insulating layer 44 between the first lower metal interconnections 39.

A passivation layer 56 is formed over the first topmost metal layers 51. The passivation layer 56 may include at least a silicon nitride layer. For example, the passivation layer 56 may be formed by sequentially stacking a plasma silicon oxide layer 53 and a plasma silicon nitride layer 55. In this case, the plasma silicon nitride layer 55 is formed using a silicon source gas and a nitrogen source gas as process gases. The silicon source gas may be a silane ($SiH_4$) gas, and the nitrogen source gas may be an ammonia ($NH_3$) gas. Therefore, the plasma silicon nitride layer 55 may contain hydrogen atoms.

The substrate 11 having the passivation layer 56 is subject to an annealing process, for example, a metal alloy process. The metal alloy process may be performed using a hydrogen gas and a nitrogen gas as ambient gases 57 at a temperature of about 400° C. The hydrogen atoms in the ambient gases may reach the interfaces of the cell gate insulating layer 15, for example, between the surface of the substrate 11 and the cell gate insulating layer 15 through the first openings 51s and the overlap regions V during the metal alloy process or other suitable annealing processes that can provide hydrogen atoms at the interfaces to reduce the interface trap density. In other words, the first openings 51s act as hydrogen paths through which the hydrogen atoms can reach the interfaces of the cell gate insulating layer, for example, between the cell gate insulating layer 15 and the substrate surface. As a result, the interface trap sites are filled with the hydrogen atoms, thereby significantly decreasing the interface trap density. Although applicant of the present invention does not wish to be held to a particular theory of operation, the hydrogen atoms may also passivate unsatisfied chemical bonds or so-called "dangling bonds" at the semiconductor substrate surface, thereby decreasing the interface trap density. Thus, the leakage current characteristics of the cell MOS transistors are significantly improved to increase a refresh cycle time of a memory device such as a DRAM device.

Furthermore, the hydrogen atoms in the passivation layer 56, that is, the plasma silicon nitride layer 55 may also be diffused into the interfaces of the cell gate insulating layer 15 through the first openings 51s. Thus, the leakage current characteristics of the cell MOS transistor may be further improved.

The high voltage circuit region H shown in FIGS. 4 and 5 can be manufactured using the same or similar methods as the embodiments described with reference to FIGS. 6A through 9A as well as FIGS. 6B through 9B. Hence, the description of the methods of forming the high voltage circuit region H will be omitted.

EXAMPLES

Figure 10:
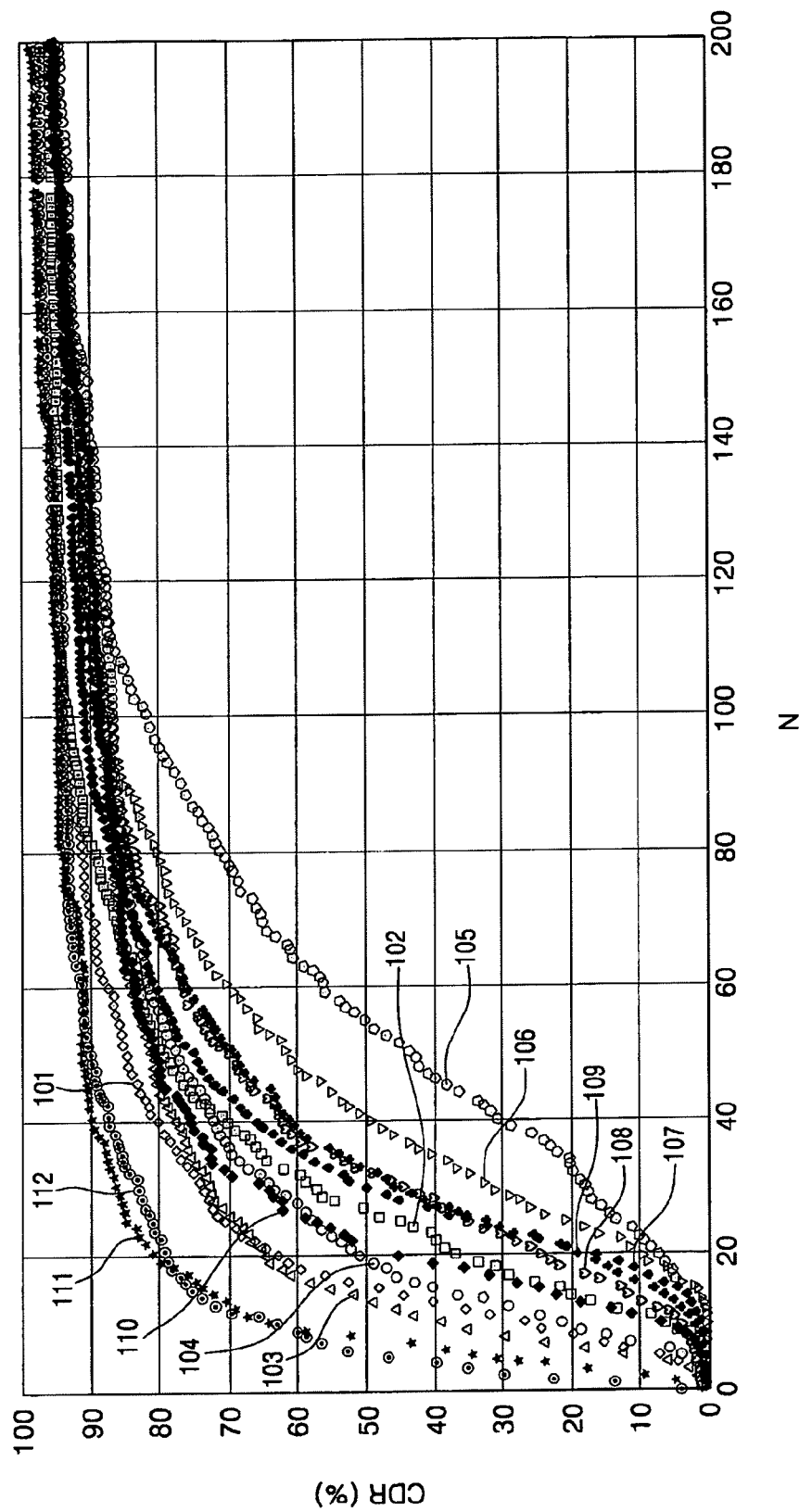
FIG. 10 is a graph illustrating cell test results of DRAM devices fabricated to indirectly demonstrate the effects of the present invention.

FIG. 10 is a graph illustrating cell test results of 256 mega bit DRAM devices fabricated to indirectly demonstrate the effects of an embodiment of the present invention. In FIG. 10, the abscissa represents the number of fail bits N, and the ordinate represents a cumulative distribution rate (CDR).

In FIG. 10, the data indicated by reference numerals '101' through '112' were obtained from the samples fabricated using key process conditions listed in the following table 1. Further, an upper electrode (that is, a plate electrode) of cell capacitors was formed by sequentially stacking a doped polysilicon layer and a titanium nitride (TiN) layer, and the titanium nitride layer was formed to a thickness of 400 Å. Here, the cell test was performed using a march test program and a refresh cycle time of 200 milliseconds (msec).

megabit DRAM devices (refer to data indicated by sample NOS. 105-110) fabricated using a lower inter-metal insulating layer composed of a PE-TEOS layer/a HDP oxide layer and a topmost metal layer without any opening exhibited 20 to 55 fail bits. That is, the DRAM devices employing a flowable oxide layer as an inter-metal insulating layer exhibited a higher production yield than that of the DRAM devices employing a HDP oxide layer as an inter-metal insulating layer. It may be understood as that this is because the flowable oxide layer is more porous than the HDP oxide layer. In other words, it may be understood to mean that hydrogen atoms generated during a subsequent metal alloy process more easily penetrate the flowable oxide layer rather than the HDP oxide layer.

On the contrary, half of 256 megabit DRAM devices fabricated using a lower inter-metal insulating layer composed of a PE-TEOS layer/a flowable oxide layer (Fox)/a PE-TEOS layer without a topmost metal layer exhibited fail bits less than 10.

Figure 11:
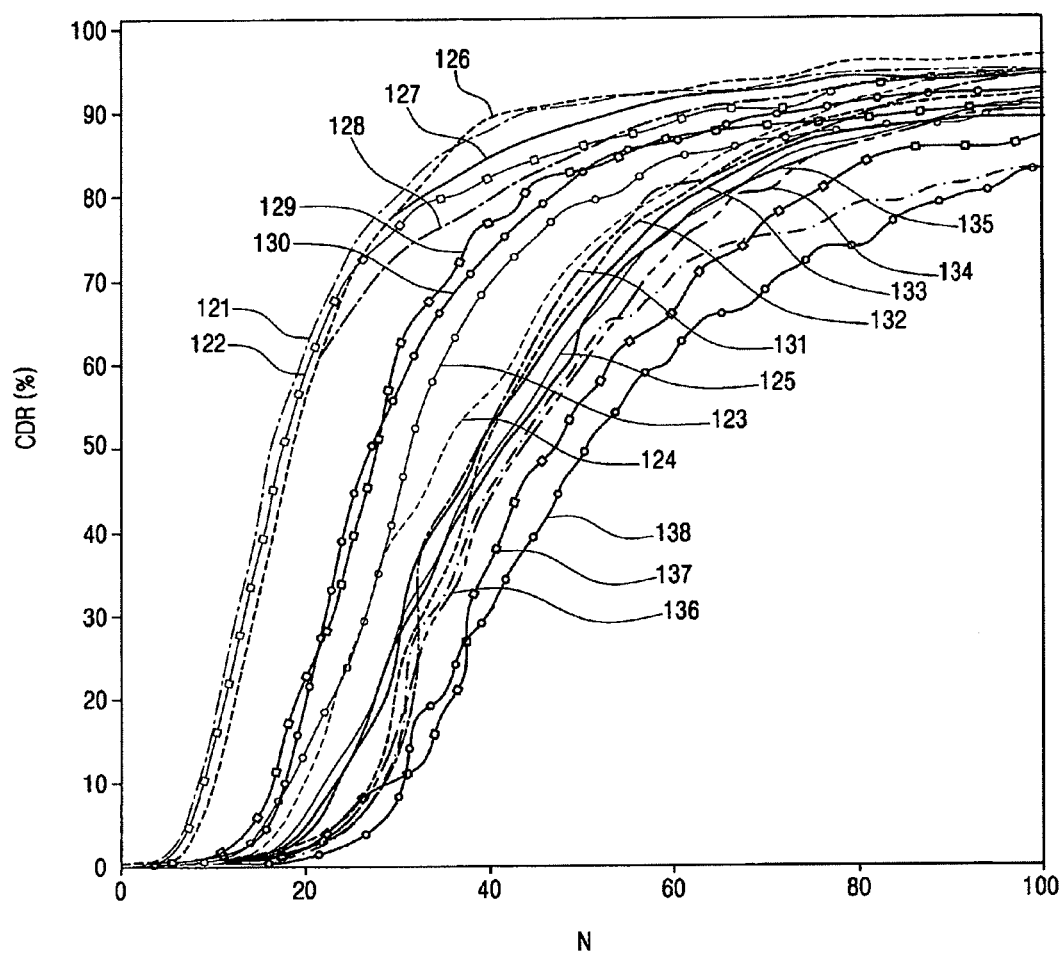
FIG. 11 is a graph illustrating cells test results of DRAM devices fabricated according to an embodiment of the present invention and a conventional art.

FIG. 11 is a graph illustrating cells test results of 256 megabit DRAM devices fabricated according to an embodiment of the present invention and a conventional art. In FIG. 11, the abscissa represents the number of fail bits N, and the ordinate represents a cumulative distribution rate (CDR).

In FIG. 11, the data indicated by reference numerals '121' through '138' were obtained from the samples fabricated using key process conditions listed in Table 2 shown below. Further, an upper electrode (that is, a plate electrode) of cell capacitors was formed by sequentially stacking a doped polysilicon layer and a titanium nitride (TiN) layer, and the titanium nitride layer was formed to a thickness of 400 Å. In

TABLE 1

| | | Sample No. | | |
|---|---|---|---|---|
| process parameters | | 101~104 | 105~110 | 111~112 |
| lower metal interconnection (M1) | | Al alloy layer (4000 Å) | | |
| lower IMD | lower capping layer | PE-TEOS layer (1000 Å) | | |
| | upper capping layer | Fox/PE-TEOS (4000 Å) | HDP oxide layer | Fox/PE-TEOS (4000 Å) |
| upper metal interconnection (M2) | | Al alloy layer (6000 Å) | | |
| upper IMD | Lower capping layer | PE-TEOS layer (1000 Å) | | |
| | upper capping layer | HDP oxide layer | | |
| topmost metal layer (M3) on a cell array region | | Al alloy layer (8000 Å), Plate layer, without openings | | skipped |
| passivation layer | | HDP oxide layer (8000 Å)/PECVD SiN layer (6000 Å) | | |
| annealing (metal alloy) | | 400° C., 180 minutes, $H_2$ gas + $N_2$ gas | | |

As can be seen from FIG. 10 and Table 1, half of 256 megabit DRAM devices (refer to data indicated by sample Nos. 101-104) fabricated using a lower inter-metal insulating layer composed of a PE-TEOS layer/a flowable oxide layer (Fox)/a PE-TEOS layer and a topmost metal layer without any opening exhibited 10 to 30 fail bits, and half of 256 addition, each of the 256 megabit DRAM devices was designed to include a plurality of unit cell blocks, and each of the unit cell blocks was designed to have a width of 145 μm and a length of 273.4 μm. Here, the cell test was also performed using a march test program and a refresh cycle time of 200 milliseconds (msec).

TABLE 2

| | | Sample No. | | |
|---|---|---|---|---|
| process parameters | | 121~125 (present invention) | 126~130 (present invention) | 131~138 (conventional art) |
| lower metal interconnection (M1) | | Al alloy layer (4000 Å) | | |
| lower IMD | lower capping layer | PE-TEOS layer (1000 Å) | | |

TABLE 2-continued

| | | Sample No. | | |
|---|---|---|---|---|
| process parameters | | 121~125 (present invention) | 126~130 (present invention) | 131~138 (conventional art) |
| | upper capping layer | Fox/PE-TEOS (4000 Å) | | |
| upper metal interconnection (M2) | | Al alloy layer (6000 Å) | | |
| upper IMD | lower capping layer | PE-TEOS layer (1000 Å) | | |
| | upper capping layer | HDP oxide layer | | |
| topmost metal layer (M3) on a cell array | | Al alloy layer (8000 Å), | | |
| openings in a topmost metal layer (slits) | | width (W); 2 µm distance (D); 8 µm length; 252.46 µm | width (W); 2 µm distance (D); 4 µm length; 252.46 µm | None |
| passivation layer | | HDP oxide layer (8000 Å)/PECVD SiN layer (6000 Å) | | |
| annealing (metal alloy) | | 400° C., 180 minutes, $H_2$ gas + $N_2$ gas | | |

As can be seen from FIG. 11 and Table 2, half of 256 megabit DRAM devices (refer to data indicated by sample No. 131-138) fabricated using a planar type topmost metal layer without any slit exhibited about 37 to 50 fail bits. In contrast, half of 256 megabit DRAM devices (refer to data indicated by sample NO. 121-125) fabricated using a topmost metal layer having a slit pitch of 10 µm exhibited about 15 to 35 fail bits, and half of 256 megabit DRAM devices (refer to data indicated by sample NO. 126-130) fabricated using a topmost metal layer having a slit pitch of 6 µm exhibited about 20 to 30 fail bits.

According to the above cell test results, it can be understood that a production yield of DRAM devices is increased at the same refresh cycle time when the overlap area between the metal layers and/or the metal interconnections formed on a cell array region is reduced. In other words, if the opening area of the topmost metal layer over the cell array region is increased, the number of hydrogen atoms reaching the cell MOS transistors of DRAM devices may also be increased during a metal alloy process to significantly reduce an interface trap density. As a result, leakage current characteristic of the cell MOS transistors may be improved to increase a refresh cycle time of DRAM devices.

As described above, according to some embodiments of the present invention, openings penetrating a topmost metal layer over a cell array region and/or a peripheral circuit region are provided. Thus, the number of hydrogen atoms supplied to the interfaces of gate insulating layers of cell MOS transistors and/or peripheral MOS transistors may be increased during an annealing process such as a metal alloy process, thereby improving performance (production yield and/or refresh characteristics) of a DRAM device.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Having described and illustrated the principles of the invention in several preferred embodiments, it should be apparent that the embodiments may be modified in arrangement and detail without departing from such principles. We claim all modifications and variation coming within the spirit and scope of the following claims.

What is claimed is:

1. A method of fabricating a semiconductor device comprising:
   preparing a semiconductor substrate having a cell array region;
   forming an interlayer insulating layer covering the semiconductor substrate;
   forming lower metal interconnections on the interlayer insulating layer in the cell array region;
   forming upper metal interconnections in the cell array region crossing over the lower metal interconnections; and
   forming a topmost conductive layer having at least one opening on the interlayer insulating layer in the cell array region,
   wherein all sides of the opening are surrounded by the topmost conductive layer.

2. The method according to claim 1, further comprising:
   forming a lower inter-metal insulating layer over the lower metal interconnections, wherein the topmost conductive layer is formed so that the at least one opening is located over at least a portion of the lower inter-metal insulating layer between the lower metal interconnections.

3. The method according to claim 2, further comprising:
   forming an upper inter-metal insulating layer over the upper metal interconnections, wherein the upper metal interconnections are formed on the lower inter-metal insulating layer, and
   wherein the topmost conductive layer is formed so that the at least one opening is located over at least one of overlap regions of the lower inter-metal insulating layer between the lower metal interconnections and the upper inter-metal insulating layer between the upper metal interconnections.

4. The method according to claim 1, wherein the at least one opening is formed to include a plurality of slits and/or a plurality of holes.

5. The method according to claim 4, wherein each of the plurality of holes is formed to have a diameter equal to or greater than about 0.2 μm.

6. The method according to claim 1, further comprising:
forming a passivation layer over the topmost conductive layer; and
annealing the substrate having the passivation layer.

7. The method according to claim 6, wherein the passivation layer is formed by sequentially stacking a silicon oxide layer and a silicon nitride layer.

8. The method according to claim 6, wherein annealing the substrate is performed using an ambient gas containing a hydrogen gas.

9. The method according to claim 6, wherein the opening has sidewalls covered by the passivation layer.

10. The method according to claim 1, wherein the topmost conductive layer covers a relatively wider area and exposes a relatively smaller area in the cell array region.

11. A method of fabricating a semiconductor device, the method comprising:
providing a semiconductor substrate having a cell array region and a peripheral circuit region;
forming a plurality of memory cells and at least one peripheral MOS transistor on the semiconductor substrate in the cell array region and on the semiconductor substrate in the peripheral circuit region, respectively;
forming an interlayer insulating layer over the memory cells and the peripheral MOS transistor;
forming first lower metal interconnections on the interlayer insulating layer in the cell array region;
forming first upper metal interconnections in the cell array region, the first upper metal interconnections extending perpendicular to and crossing over the first lower metal interconnections; and
forming a first topmost metal layer and a second topmost metal layer on the interlayer insulating layer in the cell array region and on the interlayer insulating layer in the peripheral circuit region respectively,
wherein the first topmost metal layer is formed to have at least one first opening over the cell array region and the second topmost metal layer is formed to have at least one second opening over the peripheral MOS transistor,
wherein the first and second openings are surrounded by the first and second topmost metal layers, respectively.

12. The method according to claim 11, further comprising:
forming a lower inter-metal insulating layer over the first lower metal interconnections,
wherein the first topmost metal layer is formed so that the at least one first opening is located over at least a portion of the lower inter-metal insulating layer between the first lower metal interconnections.

13. The method according to claim 12, further comprising:
forming an upper inter-metal insulating layer over the first upper metal interconnections, wherein the first upper metal interconnections are formed on the lower inter-metal insulating layer, and
wherein the first topmost metal layer is formed so that the at least one first opening is located over at least one of overlap regions of the lower inter-metal insulating layer between the first lower metal interconnections and the upper inter-metal insulating layer between the first upper metal interconnections.

14. The method according to claim 11, further comprising:
forming second lower metal interconnections on the interlayer insulating layer in the peripheral circuit region; and
forming a lower inter-metal insulating layer over the first and second lower metal interconnections,
wherein the first topmost metal layer is formed so that the at least one first opening is disposed over at least a portion of the lower inter-metal insulating layer between the first lower metal interconnections, and the second topmost metal layer is formed so that the at least one second opening is located over at least a portion of the lower inter-metal insulating layer between the second lower metal interconnections.

15. The method according to claim 14, further comprising:
forming second upper metal interconnections on the lower inter-metal insulating layer in the peripheral circuit region, the second upper metal interconnections crossing over the second lower metal interconnections, wherein first upper metal interconnections are formed on the lower inter-metal insulating layer; and
forming an upper inter-metal insulating layer over the first and second upper metal interconnections,
wherein the first topmost metal layer is formed so that the at least one first opening is located over at least one of overlap regions of the lower inter-metal insulating layer between the first lower metal interconnections and the upper inter-metal insulating layer between the first upper metal interconnections, and
the second topmost metal layer is formed so that the at least one second opening is located over at least one of overlap regions of the lower inter-metal insulating layer between the second lower metal interconnections and the upper inter-metal insulating layer between the second upper metal interconnections.

16. The method according to claim 11, wherein the at least one first opening is formed to include a plurality of first slits and/or a plurality of first holes penetrating the first topmost metal layer, and the at least one second opening is formed to include a plurality of second slits and/or a plurality of second holes penetrating the second topmost metal layer.

17. The method according to claim 16, wherein a width of the first and second slits is equal to or greater than about 0.5 μm, and a diameter of the first and second holes is equal to or greater than about 0.2 μm.

18. The method according to claim 11, further comprising:
forming a passivation layer over the first and second topmost metal layers; and
annealing the substrate having the passivation layer.

19. The method according to claim 18, wherein the passivation layer is formed by sequentially stacking a silicon oxide layer and a silicon nitride layer.

20. The method according to claim 18, wherein annealing the substrate is performed using an ambient gas containing a hydrogen gas.

21. The method according to claim 18, wherein the first and second openings have sidewalls covered by the passivation layer, respectively.

22. The method according to claim 11, wherein the second topmost metal layer covers a relatively wider area and exposes a relatively smaller area in the peripheral circuit region.

* * * * *